United States Patent [19]

Kroger

[11] Patent Number: 4,536,781

[45] Date of Patent: Aug. 20, 1985

[54] FABRICATION OF SUPERCONDUCTIVE TUNNELING JUNCTION RESISTORS AND SHORT CIRCUITS BY ION IMPLANTATION

[75] Inventor: Harry Kroger, Sudbury, Mass.

[73] Assignee: Sperry Corporation, New York, N.Y.

[21] Appl. No.: 468,604

[22] Filed: Feb. 22, 1983

[51] Int. Cl.$^3$ .................... H01L 39/22; H01L 39/12
[52] U.S. Cl. ............................................ 357/5; 357/4
[58] Field of Search ....................................... 357/4, 5

[56] References Cited

PUBLICATIONS

J. C. Villegier & J. C. Veler, Investigation of High Rate Magnetron Sputtering of Niobium Films for Josephson Integrated Circuits, Proc. Applied Superconductivity Conference, Nov. 30, 1982.

Primary Examiner—Andrew J. James
Assistant Examiner—E. Fallick
Attorney, Agent, or Firm—Howard P. Terry; Arnold L. Albin

[57] ABSTRACT

A superconductive junction device for fabricating Josephson integrated circuits is useful for replacing deposited thin-film resistors and for short-circuit device interconnections. Derived by "poisoning" a superconductive electrode or altering the barrier of a tunnel junction, the device displays controllable resistive properties at normal superconducting transition temperatures at substantial savings in the space occupied. Methods of fabricating the device using the selective niobium anodization process and ion implantation process are disclosed. When both upper and lower superconductive electrodes are poisoned, the device has linear properties whose resistance is identical to the normal resistance of unpoisoned junctions. Superconducting short circuits are readily obtained by oxygen ion implantation in thin film niobium electrodes.

13 Claims, 5 Drawing Figures

FABRICATION OF SUPERCONDUCTIVE TUNNELING JUNCTION RESISTORS AND SHORT CIRCUITS BY ION IMPLANTATION

BACKGROUND OF THE INVENTION

1. Field of the Invention

The invention relates to superconductive integrated circuits and more particularly to Josephson tunneling junctions adapted to replace deposited thin film resistors. The invention is particularly applicable to Josephson integrated circuits with multiple tunneling junctions and readily provides effective superconducting short circuits.

2. Description of the Prior Art

In the manufacture of many integrated circuits, particularly those incorporating Josephson junctions, it is often desirable to form resistive elements by depositing a metallic layer upon an insulating surface. By means of masked etching or lift-off processing the desired geometry of the thin film material is obtained. The film material used must exhibit resistive properties when operated at superconducting temperatures. Such materials as gold-indium alloy, copper-germanium alloy, and molybdenum have been used in the prior art.

One problem observed in the prior art is that where the substrate includes steep or re-entrant angles, it is difficult to deposit layers of substantially uniform thickness. Further, for some applications, such as in a power bus, resistance values must be trimmed to conform to the desired critical currents of the Josephson junctions. Where the junction parameters vary over the substrate, experimental adjustment of the resistance values may be desirable. In a multilayer structure, this imposes substantial practical problems and requires additional processing steps. Where relatively high resistance values are required, a thin resistor of extended length is required. Such a resistor may exhibit undesirable inductance, as well as consuming appreciable circuit area. Further, undesired parasitic contact resistance may be experienced at the interface between the resistor and superconductive layers.

Since the specific resistance for a given material is fixed, resistance is varied by choosing appropriate lengths and widths over a relatively narrow range of deposit thicknesses. Limitations of choice of suitable resistive materials dictate that substantial areas are required to define values of resistors most commonly used in Josephson junctions, substantially exceeding the dimensions of the junctions themselves. These values may range from less than 0.3 ohms to greater than 30 ohms. In the prior art, for example, a resistor of the order of 30 ohms formed from material with a sheet resistance of 2 ohms/square would require an area of 93.75 $\mu m^2$ compared with a typical junction area of 6.25 $\mu m^2$, representing a ratio of 15:1. For a multiple junction application, as in a 1:2:1 interferometer, for example, a multiplicity of such resistive elements is required, with consequent consumption of chip area.

It is also noted that Josephson logic gates generally have low gain and therefore small operating margins. Resistive elements are a necessary part of these logic gates and as has been noted herein the values of the resistances are difficult to control in fabrication. Nevertheless, close control of such resistance is critical. In general, where the range of resistance values is closely controlled, an active Josephson device will permit correct operation of the gates over a relatively wide possible range of parameters.

Three important parameters of Josephson devices are the critical current $I_c$, normal resistance $R_N$, and the sub-gap resistance $R_S$. The product of $I_c$ and $R_S$ is commonly referred to as $V_m$. The sub-gap resistance $R_S$ is generally not a constant but varies with the applied voltage and is conventionally measured at a particular sub-gap voltage of the order of 1.5–2.0 mV as appropriate for the particular logic gate in which the devices are incorporated. Thus, for example, the sub-gap resistance may be conveniently measured at $V_g/2$, where $V_g$ is the gap voltage of the junction (See FIG. 5). The normal resistance is determined by the slope of the I-V curve above $V_g$. The $I_cR_n$ product and $V_m$ are generally well controlled across a wafer with good control of the fabrication techniques. However, local variations in lithography due to imperfect masks, variations in exposure or photoresist thickness, etc. can change the device area and thereby change $I_c$ and the corresponding values of $R_N$ and $R_S$ across the wafer. Systematic variations may also occur across a wafer because of variations in the barrier thickness. It has been found that such barrier formation variations are present even in the most highly developed formation techniques, which otherwise yield acceptable devices. Such techniques include plasma oxidation and silicon barrier deposition.

Some techniques for altering the electrical properties of Josephson junctions have been previously described, although not for the purpose of fabricating resistive elements. A method for altering the low voltage resistance of a Josephson junction without affecting the zero voltage supercurrent, utilizing a proximity effect structure, was described by J. Matisoo in IBM Technical Disclosure Bulletin V16, No. 5, pp. 1437–9, October 1973. Other techniques have been applied for modifying Josephson junctions in order to increase the yield. For example, indium has been deposited on the counter-electrode, which diffuses through to the tunnel barrier and increases the magnitude of the critical current. As another example, junctions have been annealed to increase critical current. While these methods can be accomplished with the required selectivity, they do not change the essential functionality of the device as a Josephson junction, and are not methods of making resistors from Josephson junctions as described herein.

The introduction of impurities into niobium electrodes as a means of preparing low resistivity resistors has also been suggested in a paper by J. C. Villegier and J. C. Veler, to be published in the proceedings of the Applied Superconductivity Conference, Nov. 30, 1982. A method for making resistive elements out of superconductive junctions is described by L. N. Smith in Ser. No. 468,603, Superconductive Tunneling Junction Resistor and Method of Fabrication, assigned to the assignee of the present invention. This method provides the beneficial advantages of converting superconducting junctions into normal junctions by poisoning at least one of the electrodes, without altering the barrier. However, it does not disclose the advantageous properties that may be obtained by also poisoning the barrier, where the normal resistance may be reduced to as low as zero ohms, at the expense of the need for more critical control over the processing steps.

SUMMARY OF THE INVENTION

The present invention proposes methods for altering a tunnel junction itself to obtain ohmic resistive values, while not exceeding the minimal space requirements of a normal superconductive junction. The method may be used exclusively in a superconductive logic circuit for resistor fabrication, or in combination with conventional film resistor structures, or with the junction resistor disclosed by Smith in said Ser. No. 468,603. It has been found that the novel ion implantation invention described herein permits transforming an active Josephson device into a resistive element by disrupting the barrier and poisoning one of the electrodes in a selected region on a substrate on which associated Josephson junctions are colocated, with the value of resistance determined by the dosage and energy level of the implantation process. The methods described herein result in a proportional scaling of active device properties with that of the normal resistance $R_N$. Thus, where both active devices and resistive devices are incorporated on the same wafer, the relative resistance ratio $R_N/R$ of the normal resistance to the normal resistor will vary proportionately and thereby permit correct operation of a logic gate even though both the normal resistance $R_N$ of an active device and the resistance R of the normal resistor device both may vary individually across the wafer due to the factors disclosed above. For example, a thinner barrier will produce a lower normal resistance $R_N$ and subgap resistance $R_S$, and hence allow a higher critical current $I_c$.

In accordance with the present invention it has been found that certain resistive elements may be replaced by tunneling junctions, treated to remain in a normal conductive state when operated at superconducting temperatures, thereby providing a junction of finite or zero resistance. The affected junction will thereby exhibit only resistive properties at superconducting temperatures. A junction device constructed in accordance with the preferred embodiment of the present invention includes a first layer of superconductive material, characterized by a superconducting transition temperature; a second layer of conductive material, superposed with respect to the first layer, and also characterized by a superconducting transition temperature; a barrier layer between the first and second layers for conducting tunneling current therebetween; and means for providing at least one limited region so that the junction device has a predetermined ohmic resistance when cooled to the superconducting transition temperature, wherein the means comprises chemical impurities implanted into at least a portion of the barrier layer, and wherein the chemical impurities are added by ion implantation.

DESCRIPTION OF THE PREFERRED EMBODIMENT

In the preferred embodiment herein, the normal state resistance of a superconductive tunneling junction is lowered by ions of oxygen controllably implanted to a predetermined depth in a barrier by acceleration of the ions in an electric field. The superconducting transition temperature of one or more layers of superconductive material may be also lowered to that of a nonsuperconductive material. Ohmic resistance values of less than 1 ohm have been achieved where the normal resistance was 1,000 ohms. The value of resistance may readily be controlled by varying the dosage of the gaseous element implanted and the applied accelerating energy.

The method chosen for altering the superconductive state of the junction preferably should have two characteristics: first, it should be capable of being accomplished selectively at specified locations on the circuit; second, any change in the normal resistance of the tunnel junctions should be of a relatively predictable and controllable degree so that the resistance may conveniently be predetermined by selecting the barrier thickness and geometry, and conditions of ion bombardment.

A preferred embodiment for Josephson junction fabrication using the selective local anodization technique previously described by H. Kroger, in U.S. patent application Ser. No. 179,311, and assigned to the asignee of the present invention, is especially convenient. In this process, a layer of a refractory superconductive material, preferably niobium 3,000 Å thick, is deposited, followed by formation of the Josephson barrier. The barrier may be formed either by oxidizing the base layer of niobium or by depositing a thin layer of barrier material, such as hydrogenated silicon. A second layer of superconductive material such as niobium is then deposited over the barrier to a thickness, for example, of 200–600 Å. The resulting structure constitutes a Josephson junction covering the entire substrate area.

In the following discussion, reference is made to S-I-S, S-I-N, and N-I-N junctions. Note that all three junction devices have the same normal resistance, since this is characterized by the tunneling barrier thickness and the device area, but is not a function of the normal or superconducting state of the electrodes.

Figure 1:
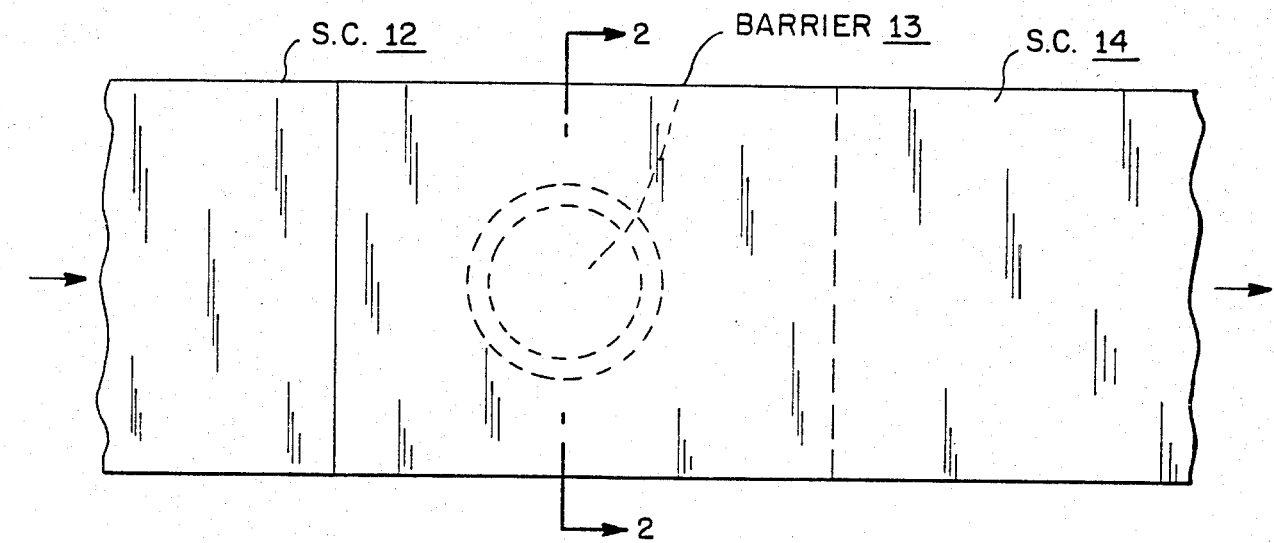
FIG. 1 is a plan view of a Josephson superconducting tunnel junction device.
Figure 2:
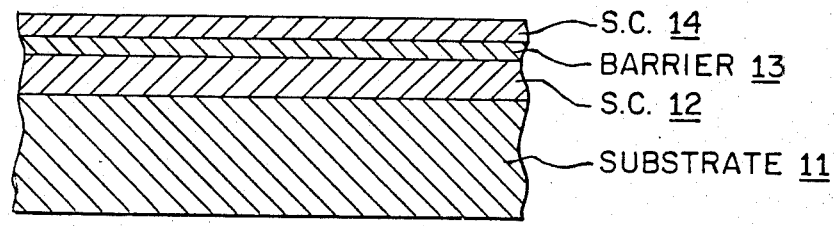
FIG. 2 is a fragmentary cross-section in elevation of the tunnel junction of FIG. 1 taken along lines 2—2, showing the layered structure of the junction.
Figure 3:
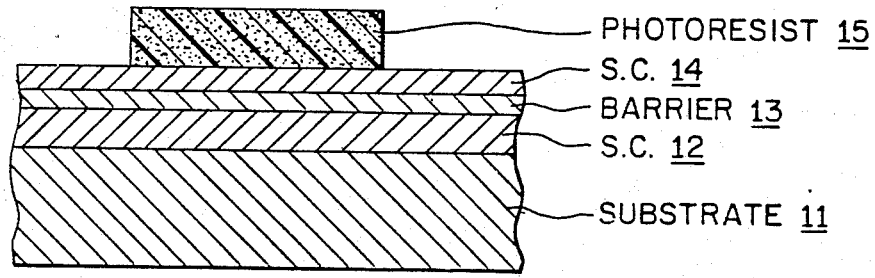
FIG. 3 is the junction of FIG. 2, showing the added step of masking the junction area for anodization in the SNAP process of junction definition.
Figure 4:
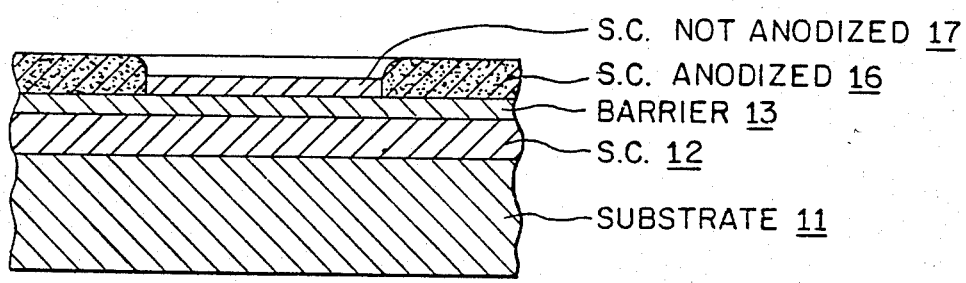
FIG. 4 is the junction of FIG. 3 after anodization and stripping of the mask.

FIG. 1 shows a plan view of a Josephson junction as used in the present invention. A barrier layer 13 is confined between a lower layer 12 of superconductive material and an upper layer 14, also of superconductive material. Referring now to FIG. 2, a substrate 11 which may be a crystalline silicon substrate with an oxidized surface has deposited thereon a thin film of superconductive material 12, preferably niobium, with a barrier 13 comprised, for example, of amorphous hydrogenated silicon deposited by RF diode sputtering in a partial hydrogen atmosphere and 30–400 Å in thickness. An upper superconductive layer 14, also preferably of niobium, is next applied, preferably within the same vacuum chamber either by electron beam evaporation or by sputter deposition, to form the second of the two superposed superconductive layers. The superconductive lower layer 12, barrier 13, and upper superconductive layer 14 form a tri-layer structure which may be processed to form individual Josephson junctions. The lower layer 12 forms the Josephson base electrodes and the upper layer 14 forms the Josephson counter-electrodes. The lower layer 12 may also be utilized as the ground plane for the structure. As shown in FIG. 3, individual small area junctions are next defined by forming a photoresist mask 15 over those regions to be utilized as junctions, followed by anodizing the entire upper niobium layer 14 to completion. A thick (3,000 Å) layer of sputtered $SIO_2$ insulator may also be used as a mask. Referring to FIG. 4, the anodized upper superconductive layer 16 is seen to completely replace the upper niobium material 14 by insulation, except where masked at junction 17. When the photoresist mask is removed, it exposes a junction area 17 of the upper superconductive layer which is not anodized. Thus the junctions for the circuit are defined and the surrounding region is covered by a layer of high quality, pin-hole free insulation. The resulting structure is called a superconductor-insulator-superconductor structure, abbreviated S-I-S. The modified structures to be described in the present invention are denoted as the superconductor-insulator-normal junction (S-I-N) and the normal-insulator-normal junction (N-I-N).

Figure 5:
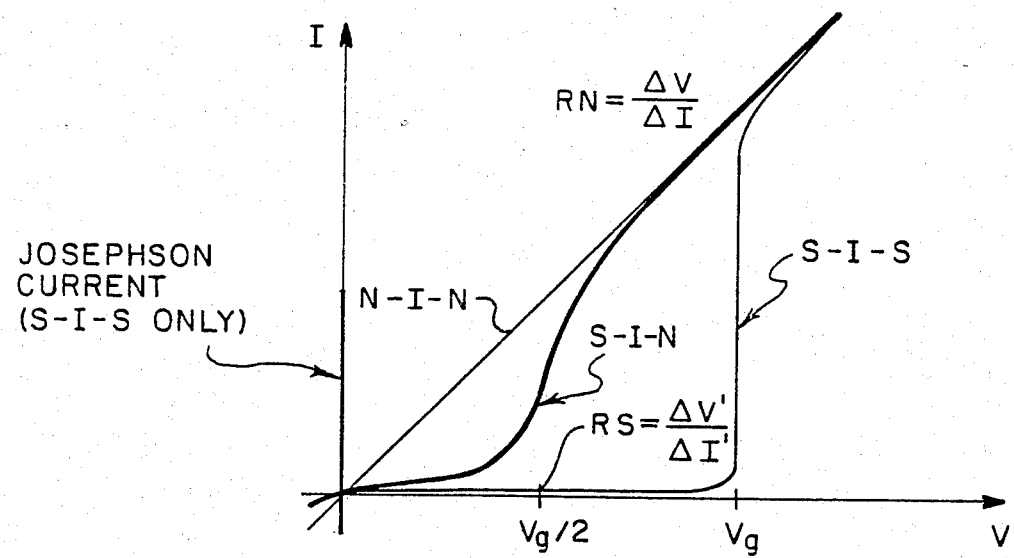
FIG. 5 is a graph of characteristic I-V curves for tunnel junctions, showing the normal resistance of various devices.

FIG. 5 shows characteristic curves of current versus voltage drop (I-V) for the tunnel junction devices disclosed herein. It may be seen that the normal resistance $R_N$ for the S-I-S, S-I-N and N-I-N devices is substantially the same value for all voltages above $V_g$, the sum of the energy gaps. The S-I-N device is seen to be highly non-linear in the region of $V_g/2$, while the N-I-N device is quite linear throughout the useful Josephson current range. The S-I-N characteristics, as shown in FIG. 5, suggest that one of the electrodes near the junction has been converted to a normal metal or poisoned by the oxygen implantation. Note the non-linear resistance change for the S-I-N characteristic at voltages below the sum of the energy gaps $V_g$, and the gradual slope of increase in current I, rather than the abrupt change observed with an S-I-S device at $V_g$. Note also that both the ohmic resistance R of the S-I-N or N-I-N devices and the normal resistance $R_N$ of the S-I-S devices will be determined by junction area and barrier thickness, while the implant dosage in energy will determine the ratio of $R_N/R$. Beneficially, the fabrication techniques of the present invention permit selectively altering the barrier or at least a portion of the barrier and one or both junction electrodes in a plurality of regions to provide junctions which have well-defined resistive characteristics at normal superconducting transistion temperatures.

In order to obtain N-I-N junctions, which provide desirable linearity of the resistive junctions, it is also necessary to poison the lower electrode as well as the upper electrode. One method by which this may be achieved is to use ion implantation. In this approach the electrode is modified after deposition but before barrier fabrication.

Ion implantation is a good technique to use where the ability to control the location and area of the junction is important. For example, to poison a base or counter electrode ions of a donor element such as hydrogen or oxygen are accelerated by a voltage of approximately 50 kv and allowed to impinge upon a layer of superconductive material. The ions penetrate layers of the order of 500 Å units in thickness. Further, in accordance with the invention, it is possible to change S-I-S devices into S-I-N devices or to even N-I-N short circuits by ion implantation of oxygen into completed trilayer Josephson devices using niobium electrodes and a silicon barrier. Note that this approach necessarily contemplates a change in the normal resistance $R_N$, as opposed to the methods o said Ser. No. 468603, where it is desired to preserve the predetermined $R_N$ values. Table I summarizes typical parameters for such devices.

TABLE I

| ION IMPLANTATION DEVICES | | | |
|---|---|---|---|
| Initial $R_N$ (ohms) | Dose ($O_{16}^+/cm^2$) | Energy (keV) | Final $R_N$ (ohms) |
| $10^3$ | $1 \times 10^{16}$ | 65 | 0 ($I_c > 100$ mA) |
| $10^3$ | $1 \times 10^{16}$ | 25 | ~1 (S-I-N) |
| $10^3$ | $1 \times 10^{15}$ | 25 | ~$10^3$ (small or no change) |
| $10^3$ | $1 \times 10^{15}$ | 65 | ~10 (S-I-N) |
| $10^3$ | $1 \times 10^{14}$ | 65 | ~$10^3$ (no change) |

The particular doses, energy, and species of superconductive electrodes and barrier, are merely illustrative and not to be construed as optimal nor limiting. At an applied potential of 65 keV, the penetration of $O_{16}^+$ ions in niobium is believed to be equal to the combined thickness of the barrier and the upper niobium layer. This potential should both posion the upper niobium layer and affect the barrier itself. At the lower range of 25,000 electron volts the penetration should not exceed the upper niobium layer and therefore it would serve only to poison the upper niobium electrode. The change in resistance from the normal state is attributed to the two mechanisms of disruption of the barrier by implantation damage and poisoning of the superconductive niobium by oxygen. It is well known in the prior art that incorporation of oxygen into thin films of niobium can lower the superconducting transition temperature of the film. Since the normal resistance of the device depends sensitively on the barrier, it is also suggested that disruption of the barrier has occurred, perhaps due to high energy oxygen ions impacting and propelling niobium ions into the silicon barrier region to produce microscopic short circuits which effectively shunt the electron-pair tunneling conductance.

Other gases and semiconductive materials may also be useful in this application. For example, hydrogen is also well known to lower the transition temperature of niobium. Since hydrogen ions, by virtue of their lower mass, are less likely to disrupt the barrier, it is anticipated that $H^+$ ions will cause a smaller change in R in the conversion from S-I-S to S-I-N or N-I-N devices. Other gases and superconductive materials may also prove advantageous.

Remarkably and unexpectedly, it should be noted from Table I that effective superconducting small-area short circuits can also be produced. The critical current of the device produced by 65 keV $O_{16}^+$ ions at a dosage of $1 \times 10^{16}/cm^2$ was in excess of 100 mA, which is substantially higher than any Josephson device or superconducting line which is being used in present Josephson circuits. The device is therefore an excellent superconductive short circuit. Thus, a Josephson device with an area comparable to that of an active Josephson tunneling junction can effectively provide zero resistance contact to the ground plane. A large-area Josephson device used as "short-circuit" contact requires up to 15 times more area since it must withstand a critical current substantially greater than the highest currents required to flow therethrough. Beneficially, fabrication of small-area short circuit devices may be accomplished during the same masking and deposition steps as used for the active Josephson devices. Thus, for example, conventional masking of a desired Josephson device by photoresist will protect the active devices from change during the ion implantation while unprotected areas will be converted into short circuits.

The flexibility of ion implantation as a means of converting selected Josephson devices into superconducting short circuits makes it possible to produce or aid in the production of custom designed Josephson gate arrays from a predetermined library of such arrays, analogous to the custom masking of silicon-gate arrays. Such an array could contain a grid pattern of thousands of non-interconnected Josephson devices. After processing the wafer through the successive steps of layers of superconductive material and barrier and defining a multiplicity of junctions, a standard array may be converted into a custom integrated circuit for a specific application by suitable interconnections achieved through the superconducting short circuit areas and subsequent metalization of interconnections.

It may be seen that advantages of this process are:

(1) the resistance of the implanted S-I-N or N-I-N device is proportional to $R_N$ of the active S-I-S tunneling junction. This provides improved margins of Josephson junction operation where uncontrollable variations in wafer fabrication exist;

(2) the ratio $R/R_N$ of the S-I-N or N-I-N implanted device to the $R_N$ value of the S-I-S device can be changed by varying the implant energy and/or dosage. Values of $R/R_N$ much less than one can be advantageous in logic circuits such as Josephson-Atto-Weber gates, where some resistors are required to be approximately one-tenth that of the sub-gap resistance of the active Josephson devices in the circuit; and (3) the implant dosage and energy are of high reproducibility permitting close control of the reduction of normal resistance $R_N$.

While not limited to circuits fabricated with the selective niobium anodization process (SNAP), the process is particularly adapted to SNAP because it is relatively easy to alter the transition temperature of niobium as has been demonstrated in the construction of S-I-N devices.

While the invention described herein has discussed niobium electrodes because of their adaptability to the SNAP process, such usage is exemplary only, and the methods herein are adaptable to conventional processes and non-refractory superconductive metals, such as lead alloys. It is also noted that the drawings herein have been exaggerated in details of scale for clarity in presentation, and do not represent the true dimensions of the devices shown.

While the invention has been described in its preferred embodiments, it is to be understood that the words which have been used are words of description rather than of limitation and that changes within the purview of the appended claims may be made without departing from the true scope and spirit of the invention in its broader aspects.

I claim:

1. In a junction device including:
a first layer of superconductive material, characterized by a superconducting transition temperature; a second layer of conductive material, superposed with respect to said first layer; a barrier layer between said first and second layers for conducting tunneling current therebetween; and means for providing at least one limited region wherein said junction device has a predetermined ohmic resistance when cooled to said superconducting transition temperature; said means comprising:
chemical impurities implanted into at least a portion of said barrier layer.

2. A junction device as set forth in claim 1, wherein said chemical impurities are added by ion implantation.

3. A junction device as set forth in claim 1 comprised of superconductor-insulator-normal layers of material.

4. A junction device as set forth in claim 3, wherein said predetermined ohmic resistance varies non-linearly with applied voltage.

5. A junction device as set forth in claim 1 comprising normal-insulator-normal materials.

6. A junction device as set forth in claim 5 wherein said predetermined ohmic resistance is constant over a range of applied voltage.

7. A junction device as set forth in claim 1 wherein said predetermined ohmic resistance is characterized by the normal resistance of an associated superconductor-insulator-superconductor junction.

8. The junction device as described in claim 1 wherein at least one of said first and second layers of materials is selected from the group consisting of niobium and niobium nitride.

9. A junction device as set forth in claim 2 wherein said chemical impurities consist of a gas selected from the group consisting of oxygen and hydrogen, and at least one of said first and second layers of material is comprised of niobium.

10. A junction device as set forth in claim 9, wherein said chemical impurities include oxygen ions of density ranging from $1 \times 10^4$ to $1 \times 10^{16}$ $O_{16}{+}/cm^2$, and said ions are accelerated by an applied energy level of $25 \times 10^3$ to $65 \times 10^3$ electron volts.

11. A junction device as set forth in claim 2 wherein said chemical impurities are implanted to a predetermined depth including the sum of the thicknesses of at least one of said first and second layer of material and at least a portion of said barrier layer.

12. A junction device as set forth in claim 2 wherein said chemical impurities are implanted to a predetermined depth including the sum of the thicknesses of said first layer and said barrier, and at least a portion of said second layer of material.

13. A junction device as set forth in claim 1, comprised of superconductor-insulator-superconductor layers of material.

* * * * *